United States Patent [19]
Suter

[11] Patent Number: 6,082,298
[45] Date of Patent: Jul. 4, 2000

[54] SUBSTRATE CARRIER FOR A VACUUM COATING APPARATUS

[75] Inventor: Rudolf Suter, Horw, Switzerland

[73] Assignee: Satis Vacuum Industries Vertriebs-AG, Küsanacht ZH, Switzerland

[21] Appl. No.: 08/854,690

[22] Filed: May 12, 1997

[30] Foreign Application Priority Data

May 10, 1996 [CH] Switzerland ............................. 1200/96

[51] Int. Cl.⁷ ................................................. C23C 16/00
[52] U.S. Cl. .......................... 118/731; 118/728; 118/729
[58] Field of Search .................................... 118/715, 720, 118/730, 731, 726, 723 VE; 204/298.41, 298.28

[56] References Cited

U.S. PATENT DOCUMENTS

| | | | |
|---|---|---|---|
| 3,799,110 | 3/1974 | Bellmann | 118/49 |
| 3,859,956 | 1/1975 | Paola . | |
| 4,817,559 | 4/1989 | Ciparisso | 118/731 |
| 5,124,019 | 6/1992 | Kunkel et al. | 204/298.15 |
| 5,138,974 | 8/1992 | Ciparisso | 118/731 |
| 5,382,345 | 1/1995 | Huang et al. | 204/298.27 |

FOREIGN PATENT DOCUMENTS

| | | | |
|---|---|---|---|
| 58107484 | 6/1983 | Japan | C23C 13/08 |
| 61130484 | 6/1986 | Japan . | |

*Primary Examiner*—Shrive Beck
*Assistant Examiner*—Sylvia R. MacArthur
*Attorney, Agent, or Firm*—Venable; Gabor Kelemen; Catherine Voorhees

[57] ABSTRACT

A vacuum coating apparatus includes a carrier accommodating substrates to be coated; and an evaporation source vertically spaced from the carrier and emitting a vapor stream onto the substrates mounted on the carrier. The carrier includes at least two radially adjoining segments each accommodating at least one substrate to be coated and a hinge interconnecting adjoining segments for allowing a tilting motion of the segments to either side relative to one another up to a predetermined angle.

5 Claims, 1 Drawing Sheet

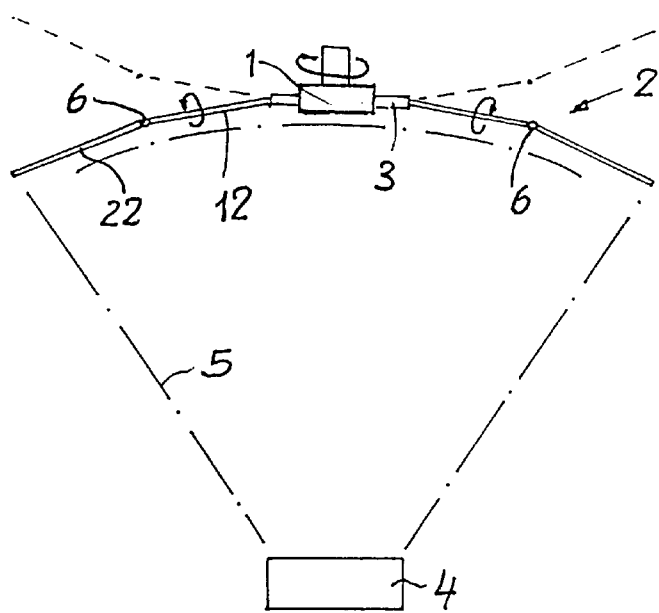
Fig. 1
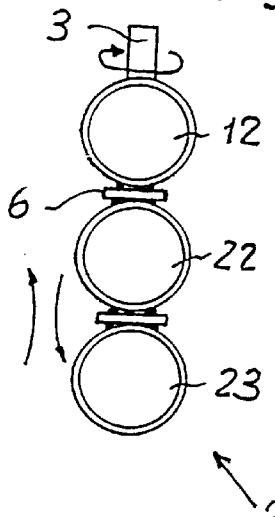
Fig. 2
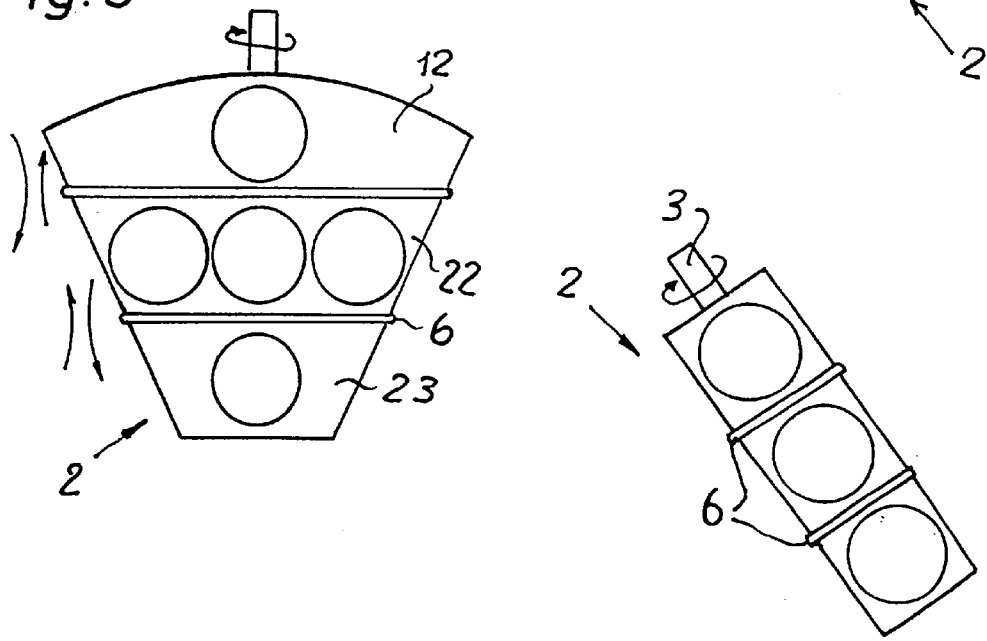
Fig. 3
Fig. 4

SUBSTRATE CARRIER FOR A VACUUM COATING APPARATUS

CROSS REFERENCE TO RELATED APPLICATION

This application claims the priority of Swiss Application No. 1200/96 filed May 10, 1996, which is incorporated herein by reference.

BACKGROUND OF THE INVENTION

This invention relates to a substrate carrier for a vacuum coating apparatus for the vacuum evaporation and deposition of antireflection coatings onto optical substrate surfaces, such as plastic spectacle lenses. The substrates can be clamped to a plurality of carriers located above replaceable evaporation sources in a vacuum container.

In known apparatus of the above type designed for the evaporation and deposition of at least one layer onto optical substrates in a vacuum, a predetermined number of such substrates are removed from the plane in which vapor deposition of one or more layers was carried out, and an equal number of substrate surfaces are moved into such plane so that these can subsequently also be coated once or several times.

For this purpose a turntable which can be placed under vacuum may be used. Such a table may be provided with a plurality of stations arranged around its circumference for the releasable fastening or subs-rates. This apparatus further comprises at least one evaporation source serving the facing substrate surfaces. Each station is provided with a substrate carrier provided with holding means for releasably fastening the respective substrates. If the individual antireflection coatings have been deposited successfully on one side of the substrate surfaces, the substrate carriers are reversed by rotating the turntable, whereupon the other substrate surfaces are coated.

Furthermore, it is known to design substrate carriers as so-called calottes for positioning a plurality of substrates on the planar, circular-segment shaped carriers. A plurality of such calottes extend dome-shaped and rotatably in the upper portion of the container, and with each calotte a plurality of substrates may be rotated simultaneously.

It is a difficulty with such arrangements that the coating stream that rises conically in the center of the container requires an exact angular position of the substrate surfaces to the conical stream in order to achieve an optimum precipitation coating, on each surface.

If the substrate carriers with one substrate each, are arranged such that they radially project from a turntable and can be rotated by 180° by a shaft, a uniform precipitation can be achieved easily by an oblique orientation of the shafts. Such a solution, however, may not be sufficient for the calotte-shaped substrate carriers where a plurality of substrates are to be mounted on the planar, circular-segment shaped carriers.

Therefore, calotte-shaped substrate carriers of the above type have been provided with substrate holders which, together with the substrate, can be freely tilted from the plane of the carrier plate to either side up to a predetermined angle. Such substrate holders, however, are. very complicated and prone to failures.

SUMMARY OF THE INVENTION

It is an object of the invention to provide an improved substrate carrier of the above-outlined type which always moves the substrate surfaces to be vacuum coated into an exact angular position relative to the cone-shaped coating stream rising in the center of the container, in order to achieve an optimum, uniform precipitation of all surfaces.

This object and others to become apparent as the specification progresses, are accomplished by the invention, according to which, briefly stated, the vacuum coating apparatus includes a carrier accommodating substrates to be coated; and an evaporation source vertically spaced from the carrier and emitting a vapor stream onto the substrates mounted on the carrier. The carrier includes at least two radially adjoining segments each accommodating at least one substrate to be coated and a hinge interconnecting adjoining segments for allowing a tilting motion of the segments to either side relative to one another up to a predetermined angle.

Independently of the shape of the substrate carrier and the number of its segments carrying the substrates and subdivided by hinges or joints, it can be ensured that after each rotation of the substrate carrier by 180°, the substrate surfaces to be coated will always assume an exact angular position to the coating beam that rises conically in the center of the container, thereby permitting an optimum, even precipitation on each substrate surface.

According to a preferred embodiment at least two, radially extending segments are provided which are coupled to the rotary shaft and which are composed of circular fastening components for the substrates. The fastening components are connected by hinges or joints, about which the substrate carrier segments may be tilted freely relative to each other toward both sides together with the substrate, up to a predetermined angle. Or a calotte-shaped plate is provided which is subdivided into at least two segments by hinges, about which the substrate carrier segments, together with the substrate, may tilt relative to each other to both sides, up to a predetermined angle. At least the center segment has means for holding at least two adjoining substrates. Or, according to still another solution, a strip-shaped arrangement is provided which is divided into at least two receiving regions for a respective substrate. Between the receiving regions a respective hinge or joint for subdividing the substrate carrier into segments is located, about which the substrate carrier segments with the substrate can be freely tilted relative to each other toward both sides, up.to a predetermined angle.

BRIEF DESCRIPTION OF THE DRAWING

FIG. 1 is a schematic side elevational view of a vacuum coating apparatus incorporating the substrate carriers according to the invention.

FIGS. 2, 3 and 4 are enlarged, schematic side elevational views of three preferred embodiments of the substrate carriers.

DESCRIPTION OF THE PREFERRED EMBODIMENTS

The vacuum coating apparatus shown in FIG. 1 for the deposition of antireflection coatings onto optical substrates, for example plastic spectacle lenses, comprises a conventional container (not shown) which can be evacuated via a vacuum pump.

In the upper chamber region of the container a reversible carrier device 1 is disposed, having a plurality of substrate carriers 2, structured according to the invention. The substrate carriers 2 (two of which are shown) are arranged radially around the circular reversible carrier device 1 and are supported on a respective rotary shaft 3 such that the substrate carriers 2 can be rotated temporarily by 180°. Each substrate carrier 2 includes non-illustrated means for a clamped holding of a substrate to be coated on both sides or for holding two substrates to be coated on one side. The inventive substrate carrier 2 will be described in more detail as the specification progresses.

In a lower, central region of the container an evaporation source 4 is located which conventionally generates a cone-shaped vacuum coating stream 5 for coating the surfaces of the substrates held by the substrate carriers 2.

In order to bring the substrate surfaces to be coated always into an exact angular position relative to the coneshaped coating stream rising in the center of the container after each turning of the substrate carrier 2 by 180°, and to achieve an optimum, uniform precipitation on each substrate surface, according to the invention at least two receiving regions or each substrate are provided in a radial extension of the substrate carrier 2. Between the receiving regions a respective hinge or joint 6 is located that subdivides the substrate carrier into segments 12, 22 which, together with the substrates, may freely tilt about the hinge 6 to either side relative to each other up to a predetermined angle, as indicated with a dashed line in FIG. 1.

Independently from the shape of the substrate carrier 2 and the number of segments 12, 22 which carry the substrates and which are subdivided by hinges or joints 6, it is thus feasible for the substrate surfaces to be coated to always assume an exact angular position relative to the cone-shaped vacuum coating stream 5, resulting in an optimum, uniform precipitation for each substrate surface, as can be seen in FIG. 1.

The variant of a substrate carrier 2 according to FIG. 2 is composed of three radially extending segments 12, 22 and 23 which are attached to the rotary shaft 3 and each of which is formed of circular holder portions for the substrates. Adjoining segments are connected by hinges or joints 6.

The variant of a substrate carrier 2 according to FIG. 3 is formed of a calotte-shaped plate subdivided into three segments 12, 22 and 23 by hinges 6. The center segment 22 has means for accepting three side-by-side arranged substrates, while the flanking segments 12 and 23 each hold a single substrate. It is to be understood that the number of substrates that can be accommodated depends on the size of the substrates relative to the carrier 2.

The variant of a substrate carrier 2 according to FIG. 4 is strip-shaped, having three substrate-receiving segments 12, 22 and 23 connected in series by joints or hinges 6. The segments, as in the previously-described embodiments, may tilt with the substrates about the hinges 6 to either side relative to each other up to a predetermined angle.

It follows from the above that the shape of the substrate carrier can vary, insofar as it permits the substrate carrier segments with the substrate to be freely tilted relative to each other to either side, up to a predetermined angle.

It will be understood that the above description of the present invention is susceptible to various modifications, changes and adaptations, and the same are intended to be comprehended within the meaning and range of equivalents of the appended claims.

What is claimed is:

1. In a vacuum coating apparatus including a carrier accommodating substrate to be coated;

an evaporation source vertically spaced from the carrier and emitting a vapor stream onto the substrates mounted on the carrier;

the improvement wherein said substrate carrier comprises (a) at least two radially adjoining segments each accommodating at least one substrate to be coated; and (b) a hinge interconnecting said adjoining segments for allowing a tilting motion of said segments to either side relative to one another up to a predetermined angle so that said segments of said substrate carrier can be angled with respect to said evaporation source.

2. The apparatus as defined in claim 1, further comprising a rotary shaft attached to said carrier for turning said carrier 180° to expose opposite surfaces of the substrates to the vapor stream.

3. The apparatus as defined in claim 1, wherein said segments form circular holding members for the substrates.

4. The apparatus as defined in claim 1, wherein said carrier is a calotte-shaped plate divided into said segments which constitute plate segments.

5. The apparatus as defined in claim 1, wherein said is strip-shaped; said segments constitute consecutive strip segments.

* * * * *